(12) United States Patent
Brink

(10) Patent No.: US 6,536,010 B1
(45) Date of Patent: Mar. 18, 2003

(54) DIGITAL TRANSMISSION SYSTEM AND METHOD

(75) Inventor: Stephan ten Brink, Allmersbach im Tal (DE)

(73) Assignee: Agere Systems Inc., Allentown, PA (US)

( * ) Notice: Subject to any disclaimer, the term of this patent is extended or adjusted under 35 U.S.C. 154(b) by 0 days.

(21) Appl. No.: 09/427,298

(22) Filed: Oct. 26, 1999

(30) Foreign Application Priority Data

Oct. 30, 1998 (EP) .......................................... 98308918

(51) Int. Cl.[7] .................... H03M 13/00; H03M 13/03
(52) U.S. Cl. ........................ 714/794; 714/774
(58) Field of Search ............................. 714/774, 701, 714/794, 792, 795; 375/286

(56) References Cited

U.S. PATENT DOCUMENTS

| | | | | |
|---|---|---|---|---|
| 5,321,725 A | * | 6/1994 | Paik et al. | 375/265 |
| 5,511,096 A | * | 4/1996 | Huang et al. | 375/265 |
| 5,512,957 A | * | 4/1996 | Hulyalkar | 348/607 |
| 5,541,955 A | * | 7/1996 | Jacobsmeyer | 375/222 |
| 5,812,601 A | * | 9/1998 | Schramm | 375/262 |
| 5,828,695 A | * | 10/1998 | Webb | 375/219 |
| 5,867,538 A | * | 2/1999 | Liu | 375/341 |
| 5,966,412 A | * | 10/1999 | Ramaswamy | 375/341 |
| 5,970,098 A | * | 10/1999 | Herzberg | 375/264 |
| 6,023,783 A | * | 2/2000 | Divsalar et al. | 714/792 |
| 6,031,874 A | * | 2/2000 | Chennakeshu et al. | 375/262 |
| 6,115,435 A | * | 9/2000 | Harada et al. | 375/341 |
| 6,212,654 B1 | * | 4/2001 | Lou et al. | 714/701 |
| 6,304,991 B1 | * | 10/2001 | Rowitch et al. | 714/755 |

FOREIGN PATENT DOCUMENTS

| | | | | |
|---|---|---|---|---|
| EP | 944200 A | * | 9/1999 | H04L/1/12 |
| WO | WO 94/27390 | | 11/1994 | H04L/5/12 |

OTHER PUBLICATIONS

Bauch, G. et al, "Iterative Equalization and Decoding in Mobile Communications Systems" Proceedings of European Personal and Mobile Communications Conference, Sep. 30, 1997, pp. 307–312.

Goff, S. et al "Turbo–Codes and High Spectral Efficiency Modulation" Serving Humanity Through Communications Supercomm/ICC, New Orleans, May 1–5, 1994, vol. 2 May 1994, pp. 645–649.

European Search Report dated Jun. 10, 1999.

* cited by examiner

*Primary Examiner*—Albert Decady
*Assistant Examiner*—Joseph D. Torres

(57) ABSTRACT

A transmission system is disclosed in which a multilevel modulated signal is transmitted. The soft output information of a channel decoder is fed back and utilized by a soft demapping device in order to improve the decoding result by further iterative decoding steps. The receiver includes a demapper for generating a demapped signal, bit deinterleaver for generating a demapped and deinterleaved signal and a decoder for generating soft reliability values representative of the decoded signal. These soft reliability values are then bit interleaved and fed back to the demapper, as a priori knowledge, for use in further iterations of the decoding process. The mapping is changed adaptively dependent on the channel conditions and the number of iterations to be used.

24 Claims, 6 Drawing Sheets

… … …

DIGITAL TRANSMISSION SYSTEM AND METHOD

CROSS-REFERENCE TO RELATED APPLICATION

Related subject matter is disclosed in the co-pending, commonly assigned, U.S. Patent application of ten Brink, entitled "Digital Transmission System and Method," which is being filed concurrently herewith.

FIELD OF THE INVENTION

This invention relates to a transmission of digital signals, e.g. in a digital radio communication system.

BACKGROUND OF THE INVENTION

Iterative decoding algorithms have become a vital field of research in digital communications. The first discovered and still most popular encoding scheme suited for iterative decoding is the parallel concatenation of two recursive systematic convolutional codes, also referred to as 'Turbo Codes'. The underlying 'Turbo Principle' is applicable more generally to other algorithms used in modern digital communications, and in the past few years, other applications of the "Turbo Principle" have been found.

Channel coding is used to make the transmitted digital information signal more robust against noise. For this the information bit sequence is encoded at the transmitter by a channel encoder and decoded at the receiver by a channel decoder. In the encoder redundant information is added to the information bit sequence in order to facilitate error correction in the decoder. For example, in a systematic channel encoding scheme the redundant information is added to the information bit sequence as additional, inserted "coded" bits. In a non-systematic encoding scheme the outgoing bits are all coded bits, and there are no longer any "naked" information bits. The number of incoming bits (information bits) at the encoder is smaller than the number of outgoing bits (information bits plus inserted coded bits, or all coded bits). The ratio of incoming/outgoing bits is called the "code rate R" (typically R=1:2).

Recent improvements using the "Turbo Principle" have shown that, in digital communication systems involving a plurality of users in wireless communication with a receiver, an improvement in the quality of the decoded signal can be achieved by applying iterative decoding steps to the received data. In particular, "Iterative Equalization and Decoding in Mobile Communication Systems" by Baunch, Khorram and Hagenauer, EPMCC'97, pp 307–312, October 1997, Bonn, Germany, discusses the application of the Turbo principle to iterative decoding of coded data transmitted over a mobile radio channel.

In order to be suitable for iterative decoding, a transmitted signal must be encoded by at least two concatenated codes, either serially or parallelly concatenated.

FIG. 1 shows a serially concatenated coding scheme: the transmission is done on a block-by-block basis. The binary signal from the digital source is encoded firstly by an outer encoder and is then passed through an interleaver, which changes the order of the incoming bit symbols to make the signal appear more random to the following processing stages. After the interleaver, the signal is encoded a second time by an 'inner encoder'. Correspondingly, at the receiver the signal is first decoded by the inner decoder in a first decoding step, deinterleaved, and decoded by the outer decoder in a second decoding step. From the outer decoder soft decision values are fed back as additional a priori input to the inner decoder. The soft decision values provide information on the reliability of the hard decision values. In a first iteration the decoding step is repeated and the soft decision values are used as input values for the first and second decoder.

The iterative decoding of a particular transmitted sequence is stopped with an arbitrary termination criterion, e.g. after a fixed number of iterations, or until a certain bit error rate is reached. It should be noted that the a priori soft value input to the inner decoder is set to zero for the very first decoding of the transmitted bit sequence ('0th iteration').

The inner and outer binary codes can be of any type: systematic, or non-systematic, block or convolutional codes. Simple mapping (e.g. antipodal or binary phase shift keying) is performed in the transmitter (after the inner encoder) and simple demapping is performed in the receiver (after the inner decoder) although for clarity this is not shown in FIG. 1. Likewise, FIG. 1 illustrates a single user scenario, although application of appropriate multiplexing provides a suitable multi user system.

At the receiver the two decoders are soft-in/soft- out decoders (SISO-decoder). A soft value represents the reliability on the bit decision of the respective bit symbol (whether 0 or 1 was sent). A soft-in decoder accepts soft reliability values for the incoming bit symbols. A soft-out decoder provides soft reliability output values on the outgoing bit symbols. The soft-out reliability values are usually more accurate than the soft-in reliability values since they are improved during the decoding process, based on the redundant information added with each encoding step at the transmitter. The best performance is achieved by a SISO-decoder which provides the A Posterior Probability calculator (APP), tailored to the respective channel code. Several faster, but sub-optimal algorithms exist, e.g. the SOVA (soft output Viterbi algorithm).

In multilevel modulation, M bits (bit symbols) are grouped together at the transmitter to form one 'mapped symbol' (also briefly referred to as 'symbol'). This symbol can be mapped onto a real or a complex signal space (i.e. real axis, or complex plane). The mapping operation simply associates the unmapped symbol (M bits, value from 0, . . . , $2^M-1$) with a discrete amplitude level for Pulse Amplitude Modulation (PAM), a discrete phase level for Phase Shift Keying (PSK), any discrete signal point in the complex plane for quadrature Amplitude Modulation (QAM) or any combination of PAM, QAM, PSK. The mapping can be of any type.

At the receiver the incoming symbols are noise affected. The hard decision demapping operation associates the incoming symbol with the closest signal point in the signal space (signal point with minimum Euclidian distance in real or complex signal space) and takes for example the respective Gray-encoded codeword as the hard decision values (O,1) for the M bits per mapped symbol.

However, if multilevel modulation is used in conjunction with channel coding and soft channel decoding (i.e. a soft input decoder) the demapping operation preferably calculates soft reliability values as inputs to the channel decoder. For simplicity, the term "multilevel modulation" is used when referring to PAM, PSK or QAM modulation, meaning "multi-amplitude level" for PAM, "multi phase level" for PSK, and "multi signal points" for QAM.

In one prior proposal, apparatus for iteratively decoding a signal has a demapper which has a first input for receiving the signal and an output for generating a demapped signal; and a decoder which has an input for receiving the demapped signal and an output for generating a decoded signal, the demapper having a second input for receiving the decoded signal.

Each user in a mobile communication system may have a different Quality of Service (QoS) requirement, i.e. different BER and latency constraints due to differing communication services. For example: voice communication has the lowest BER requirements (i.e. can tolerate many bit errors) with the highest latency constraints (i.e. cannot tolerate long delays in two way conversation); visual communication has a higher BER requirement and high latency constraints; data communication (e.g. wireless Internet web-browsing) has the highest BER requirements and the lowest latency constraints. Each user communicates with the base station with a different signal quality (i.e. SNR), multipath propagation and fading due to differing distance from the base station, propagation environment and, if mobile, speed.

The mapping operation itself does not add redundancy (in contrast to the inner encoder in classic serially concatenated encoding schemes) to the signal, but links bits together by grouping several bit symbols to form one mapped symbol.

The demapper is a soft demapping device that has been modified in order to accept a priori information obtained from the decoder. The decoder is a channel decoder and can be any SISO-decoder (optimal APP, or other sub-optimal algorithm, e.g. SOVA). The iterative demapping and decoding can thus be regarded as a serially concatenated iterative decoding scheme whereby the inner decoder is replaced by the soft demapping device. The iterative demapping and decoding is stopped by an arbitrary termination criterion (e.g. after a fixed number of iterations, or when a certain bit error rare is reached).

SUMMARY OF THE INVENTION

Mutual information is a parameter taken from information theory, see "The Elements of Information Theory" by T. M. Cover and J. A.Thomas. It specifies the maximal possible throughput for a given communication channel condition.

If we regard the mapping/demapping as part of the communication channel we can describe the maximal throughput by means of unconditional bit-wise mutual information $I_o$ of the particular mapping.

The mean unconditional bit-wise mutual information $I_o$ for no other bits of the mapping known is defined as $$I_o = \overline{I(X_k;Y)} = \frac{1}{M} \cdot \sum_{k=0}^{M-1} I(X_k;Y)$$

where

M is the number of bits of the mapping (e.g. for a 16 QAM-mapping M=4, since $2^4$=16)

$X_k$ is the $k^{th}$ bit of the mapping, with k=0... M−1; input variable to the communication channel Y is the output variable of the communication channel.

$I(X_k;Y)$ and thus $I_o$ are dependent on the applied mapping and the signal-to-noise ratio (typically given by $E_b/N_o$), and can be calculated according to methods given in "Elements of Information Theory" referred to above.

We have found by simulation, that the best mapping in an iterative demapping (IDEM) system depends on the $E_b/N_o$-region of interest and on the number of iterations NbIt that can be performed at the receiver (see FIG. 2). As explained before, this best mapping is determined by its unconditional bit-wise mutual information $I_o$. Hence, for the optimal mapping we have $I_{o,opt}$=function of ($E_b/N_o$,NbIt).

In accordance with one aspect of the invention there is provided a digital transmission system, comprising:

a coder for coding an input signal with an error checking or error correcting code, an interleaver for interleaving the bits of the coded signal, a mapper for mapping the interleaved coded signal into a multilevel signal, and a transmitter for sending the multilevel signal over a noisy channel in a transmission medium;

a receiver for receiving the multilevel signal distorted by noise (noisy multilevel signal), a demapper having a first input for receiving the noisy multilevel signal and operative to provide a soft demapped signal at an output, a deinterleaver, for deinterleaving the demapped signal, a decoder to decode the deinterleaved demapped signal to provide a soft decoded signal, an interleaver to interleave the decoded signal, the demapper having a second input for receiving the interleaved decoded signal and being operative to recalculate the demapped signal iteratively using the noisy signal and the soft decoded signal, characterized by: a mapping store for storing a plurality of different mappings;

means for deriving an indication of the channel conditions; and means for selecting the optimum mapping of the plurality dependent on the derived indication of channel conditions, the mapper and demapper being operatively responsive to the selected mapping.

In accordance with another aspect of the invention, there is provided a digital transmission system, comprising:

a coder for coding an input signal with an error checking or error correcting code, an interleaver for interleaving the bits of the coded signal, a mapper for mapping the interleaved coded signal into a multilevel signal, and a transmitter for sending the multilevel signal over a noisy channel in a transmission medium;

a receiver for receiving the multilevel signal distorted by noise (noisy multilevel signal), a demapper having a first input for receiving the noisy multilevel signal and operative to provide a soft demapped signal at an output, a deinterleaver, for deinterleaving the demapped signal, a decoder to decode the deinterleaved demapped signal to provide a soft decoded signal, an interleaver to interleave the decoded signal, the demapper having a second input for receiving the interleaved decoded signal and being operative to recalculate the demapped signal iteratively using the noisy signal and the soft decoded signal, characterized by:

a mapping store for storing a plurality of different mappings;

means for determining the number of iterations to be carried out from a plurality of possible numbers of iteration; and means for selecting the optimum mapping of the plurality, dependent on the number of iterations as determined, the mapper and demapper being operatively responsive to the selected mapping.

In accordance with yet another aspect of the invention there is provided a digital transmission system, comprising:
- a coder for coding an input signal with an error checking or error correcting code, an interleaver for interleaving the bits of the coded signal,
- a mapper for mapping the interleaved coded signal into a multilevel signal, and a transmitter for sending the multilevel signal over a noisy channel in a transmission medium;
- a receiver for receiving the multilevel signal distorted by noise (noisy multilevel signal), a demapper having a first input for receiving the noisy multilevel signal and operative to provide a soft demapped signal at an output, a deinterleaver, for deinterleaving the demapped signal, a decoder to decode the deinterleaved demapped signal to provide a soft decoded signal, an interleaver to interleave the decoded signal, the demapper having a second input for receiving the interleaved decoded signal and being operative to recalculate the demapped signal iteratively using the noisy signal and the soft decoded signal, characterized by:
- a mapping store, storing a plurality of different mappings;
- means for deriving an indication of the channel conditions;
- means for determining the number of iterations to be carried out from a plurality of possible numbers of iterations; and
- means for selecting the optimum mapping of the plurality dependent on the derived indication of channel conditions and on the number of iterations as determined, the mapper and demapper being operatively responsive to the selected mapping.

Preferably, the indication of the channel conditions is an estimate of the signal to noise ratio.

The soft output signals of the demapper and the decoder are preferably likelihood ratios more preferably log-likelihood ratios.

Each mapping is preferably stored with an indication of its mutual information, and the system includes a mutual information store storing an approximation of the optimum mutual information with a plurality of respective combinations of channel conditions and number of iterations, the means for selecting a mapping being operative to identify an optimum mutual information from the number of iterations as determined and the nearest stored channel conditions to the derived indication, and to select the mapping from the plurality for which the stored mutual information is nearest to the identified optimum.

The invention also extends to a method of transmitting a digital signal, comprising:
- coding an input signal with an error checking or error correcting code, interleaving the bits of the coded signal, mapping the interleaved coded signal into a multilevel signal, sending the multilevel signal over a noisy channel in a transmission medium;
- receiving the multilevel signal distorted by noise (noisy multilevel signal), demapping the noisy multilevel signal to provide a soft demapped signal at an output, deinterleaving the demapped signal, decoding the deinterleaved demapped signal to provide a soft decoded signal, interleaving the decoded signal, recalculating the demapped signal iteratively using the noisy signal and the soft decoded signal, characterized by:
- storing a plurality of different mappings;
- deriving an indication of the channel conditions; and
- selecting the optimum mapping of the plurality dependent on the derived indication of channel conditions, the mapping and demapping being operatively responsive to the selected mapping.

The invention further extends to a method of transmitting a digital signal, comprising:
- coding an input signal with an error checking or error correcting code, interleaving the bits of the coded signal, mapping the interleaved coded signal into a multilevel signal, sending the multilevel signal over a noisy channel in a transmission medium;
- receiving the multilevel signal distorted by noise (noisy multilevel signal), demapping the noisy multilevel signal to provide a soft demapped signal at an output, deinterleaving the demapped signal, decoding the deinterleaved demapped signal to provide a soft decoded signal, interleaving the decoded signal, recalculating the demapped signal iteratively using the noisy signal and the soft decoded signal, characterized by:
- storing a plurality of different mapping;
- determining the number of iterations to be carried out from a plurality of possible numbers of iteration; and
- selecting the optimum mapping of the plurality, dependent on the number of iterations as determined, the mapping and demapping being operatively responsive to the selected mapping.

The invention also extends to a method of transmitting a digital signal, comprising:
- coding an input signal with an error checking or error correcting code, interleaving the bits of the coded signal, mapping the interleaved coded signal into a multilevel signal, sending the multilevel signal over a noisy channel in a transmission medium;
- receiving the multilevel signal distorted by noise (noisy multilevel signal), demapping the noisy multilevel signal to provide a soft demapped signal at an output, deinterleaving the demapped signal, decoding the deinterleaved demapped signal to provide a soft decoded signal, interleaving the decoded signal, recalculating the demapped signal iteratively using the noisy signal and the soft decoded signal, characterized by:
- storing a plurality of different mappings;
- deriving an indication of the channel conditions; means for determining the number of iterations to be carried out from a plurality of possible numbers of iterations; and
- selecting the optimum mapping of the plurality dependent on the derived indication of channel conditions and on the number of iterations as determined, the mapping and demapping being operatively responsive to the selected mapping.

DETAILED DESCRIPTION

Figure 4:
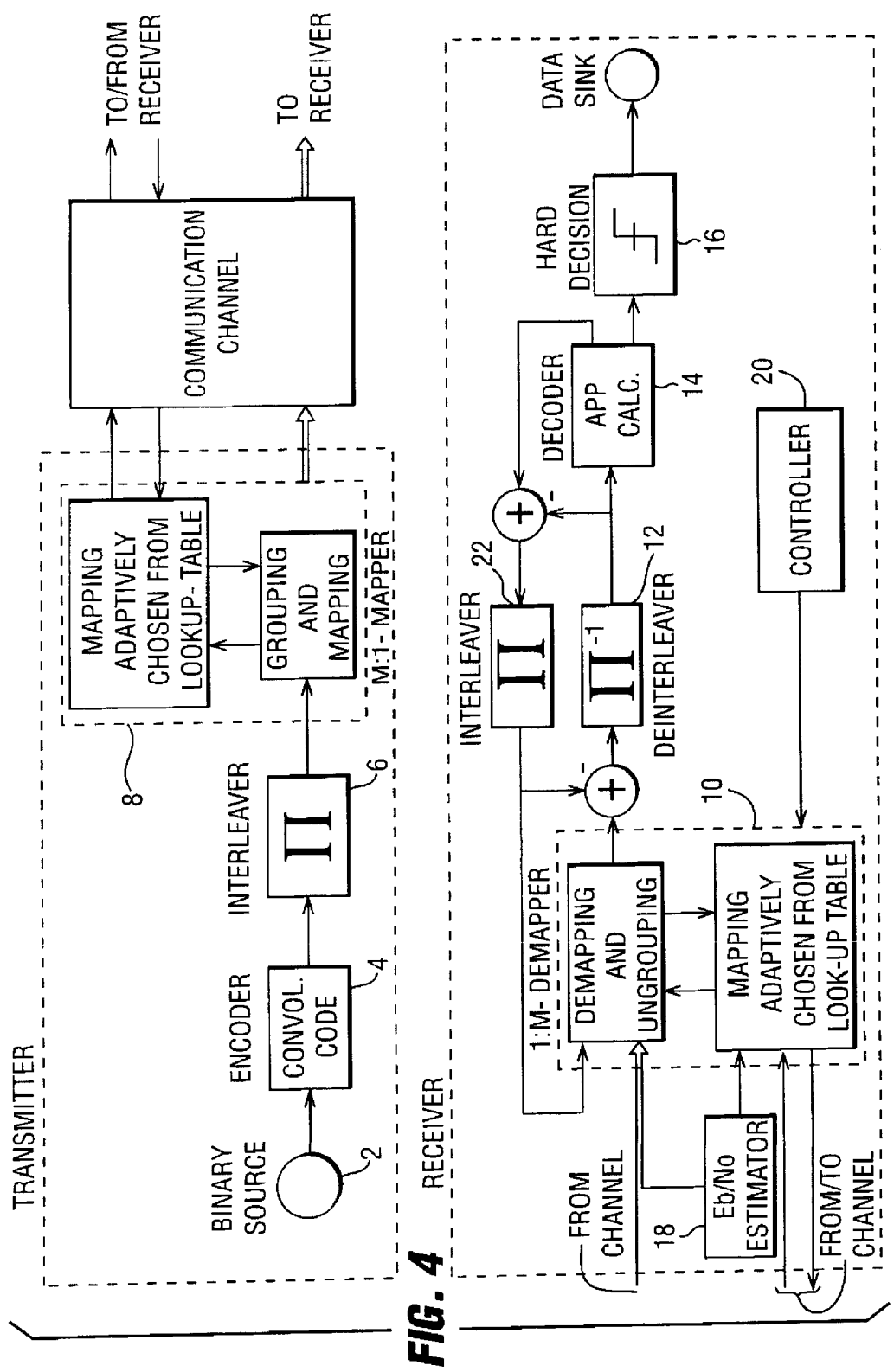
FIG. 4 shows a block diagram of a transmission system embodying the invention.

Referring to FIG. 4 at the transmitter, a random binary signal from a source 2 is convolutionally encoded by coder 4 and fed to an interleaver 6 which interleaves the bit symbols. (Any channel code can be used, non-systematic convolutional codes are used merely as an example). After the interleaver, M bits are grouped together and mapped onto a complex signal constellation by a mapper 8, according to the applied modulation scheme.

In the channel, the symbols become distorted by additive noise and any other noise form.

At the receiver the channel symbols are demapped and ungrouped by a log-likelihood ratio calculation in a demapper 10 for each of the M bits per symbol. The log-likelihood ratio values (soft values) are deinterleaved in a deinterleaver 12 and put into a coder 14 in the form of an A Posteriori Probability calculator (APP). (Any other SISO-decoder may be used). After the decoding the estimates on the transmitted information bits are available at the output of a hard decision device 16 by taking the sign of the APP- soft output values for the information bits.

In the iterative demapping/decoding path the extrinsic information is passed through a bit interleaver 22 and fed back as a priori knowledge to the soft demapping device. The extrinsic information is the difference between the soft input and the soft output value at the decoder, and depicts the new, statistically independent information (at least for the first iteration) gained by the decoding process.

The complex channel symbol z at the receiver can be considered as a matched filter output. It carries M encoded bits. Since the SISO-decoder has soft input processing, the demapping device extracts a soft value for each bit $x_O, \ldots, x_{M-1}$ for further decoding in the SISO-decoder. This soft value for each of the M bits per symbol is the log-likelihood ratio (L-value) of the respective bit conditioned on the matched filter output z. The absolute value of the L-value denotes the reliability of the bit decision.

The full term of the L-value calculation for bit $x_k$ consists of an additive 'a priori' L-value for bit $x_k$ and a fractional term in which the a priori L-values of the remaining, bits $x_{j,j}=O \ldots N-1, _{j=k}$ are included.

The a priori L-values of bits $x_O, \ldots, x_{N-1}$ are provided by the SISO-decoder as inputs to the soft demapping device.

Simulations show that the best performance of iterative soft demapping and decoding is achieved if the additive a priori L-value for bit $x_k$ is left out of the full term of the L-value for bit $x_k$, and if the a priori L-values of the remaining bits $x_{j,j}=O \ldots N-1, _{j=k}$ are considered in the calculation of the L-value for bit $x_k$. This is indicated in FIG. 4 by the subtraction after the demapping device: the a priori values coming from the SISO-decoder are subtracted from the output of the log-likelihood ratio calculation of the respective bit in the demapping device. The information that is fed to the deinterleaver can thus be regarded as the 'extrinsic information' of the demapping device (in contrast to the extrinsic information from the SISO-decoder).

Note the L-value calculation implies both, soft demapping and ungrouping of the M bits per symbol (not two separate operations, as FIG. 4 might suggest).

Iterative soft demapping and decoding reduces the bit error rate of conventional multilevel modulation schemes that use plain channel coding. Many modern digital communications systems, with simple channel coding and multilevel modulation, may be improved by altering the receiver circuitry to include a soft demapping device that accepts a priori information, and a SISO-decoder as channel decoder.

It is applicable to multilevel modulation schemes with M bits per symbol, whereby N>1 for PAM, PSK and QAM, whereby for PSK and QAM with N=2 Anti-Gray-mapping has to be applied.

It is important to note that the interleaver is a bit symbol interleaver, which interleaves the symbol on the bit level. Providing there is at least one bit symbol interleaver between encoder and mapper, other systems that apply both bit symbol and 'n bit' symbol interleavers in a serial concatenation between encoder and symbol mapper may be employed.

A signal to noise ratio estimator 18 estimates the signal to noise ratio in the channel signal. A controller 20 determines, amongst other things, how many iterations can be used for the channel. The number of iterations could change for a number of reasons, e.g. in order to reduce power consumption, the receiver could reduce the number of iterations, or in a multi-user receiver computing resources available for iterative decoding may be shifted from one user to another higher priority user.

Figure 1:
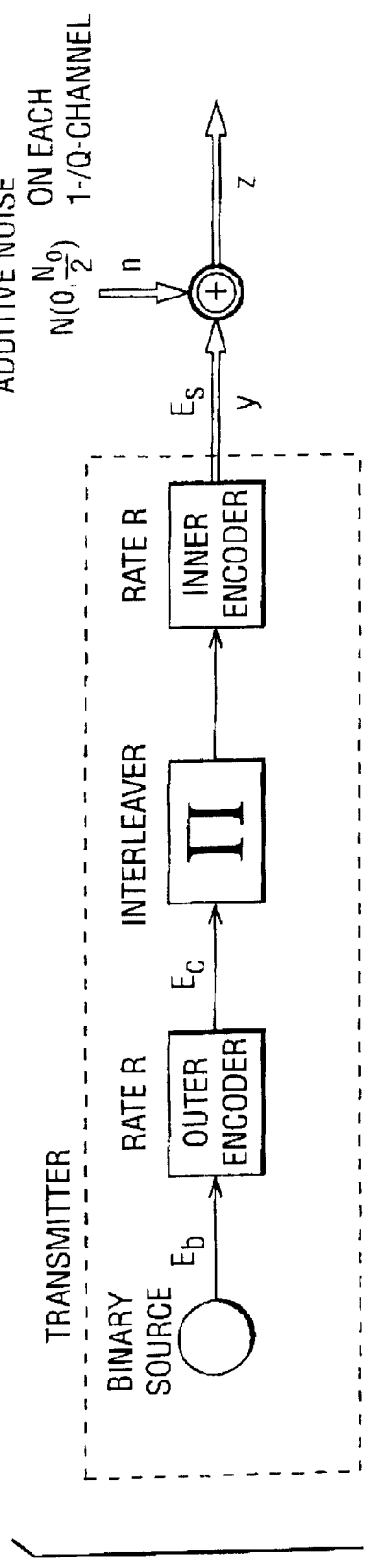
FIG. 1 is a block diagram of a prior art iterative decoding system.
Figure 2:
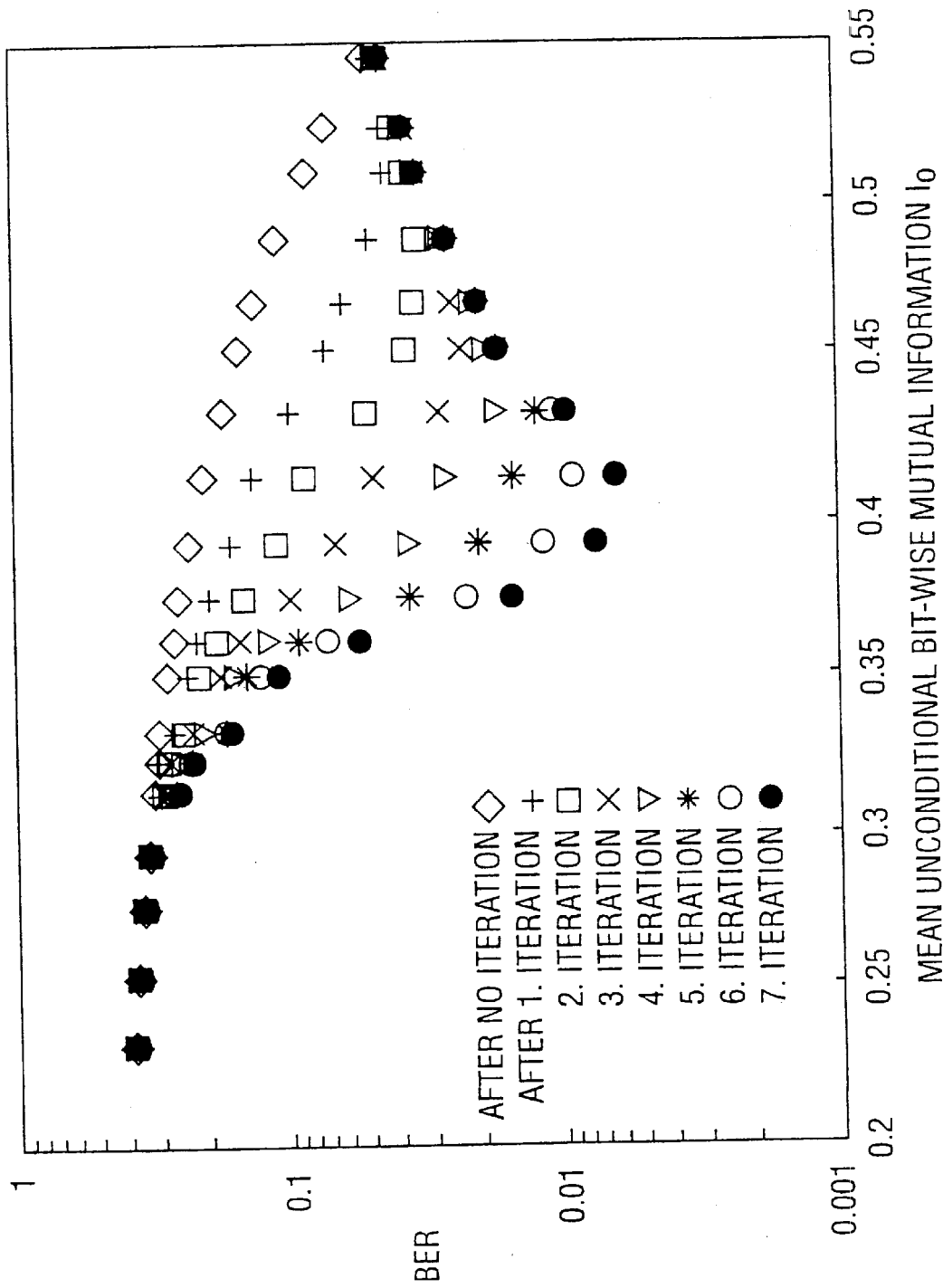
FIG. 2 shows achieved bit error rate plotted against mean unconditional bit-wise mutual information $I_o$ at one value of $E_b/N_o$ in the channel.
Figure 3:
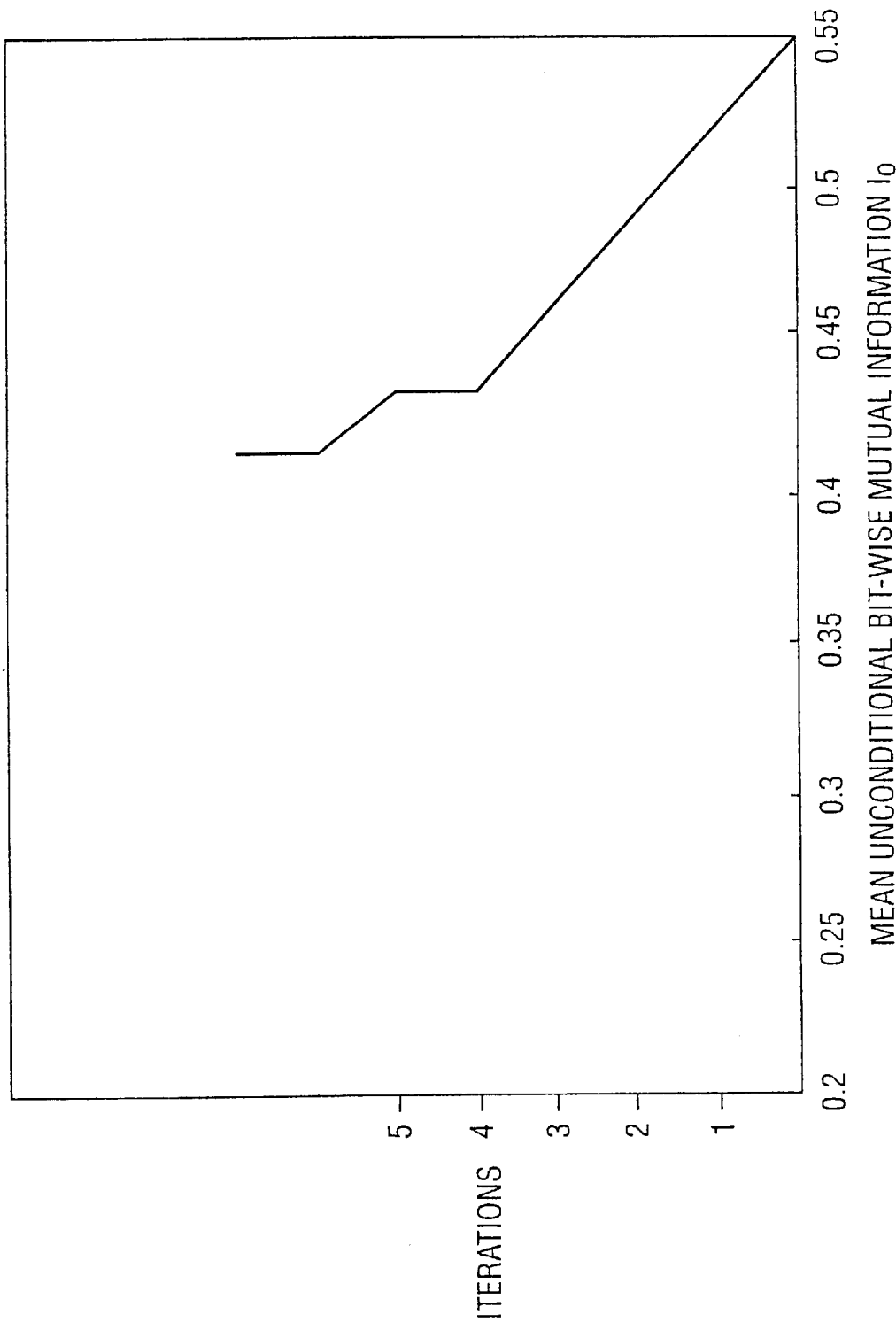
FIG. 3 shows iteration plotted against mean unconditional bitwise mutual information $I_o$ for the best bit error rate estimated from FIG. 2.

We have found by simulation, that the best mapping in an iterative demapping (IDEM) system depends on the $E_b/N_o$-region of interest and on the number of iterations NbIt that can be performed at the receiver. FIG. 2 shows the bit error ratio plotted against mean unconditional bitwise mutual information for different numbers of iteration, all at one signal to noise ratio. Different plots are obtained at different signal to noise ratios. As can be seen given the signal to noise conditions in the channel and the number of iterations which the receiver will perform, there is a minimum bit error rate in the iteratively decoded signal which occurs at a particular mean unconditional bit-wise mutual information $I_o$. Estimates of the iterations and $I_o$ at which the minima occur, for that $E_b/N_o$ are plotted in FIG. 3. Similar results are obtained for a range of different signal to noise ratios $E_b/N_o$. The results may be stored in an $I_o$ look-up table.

Figure 5:
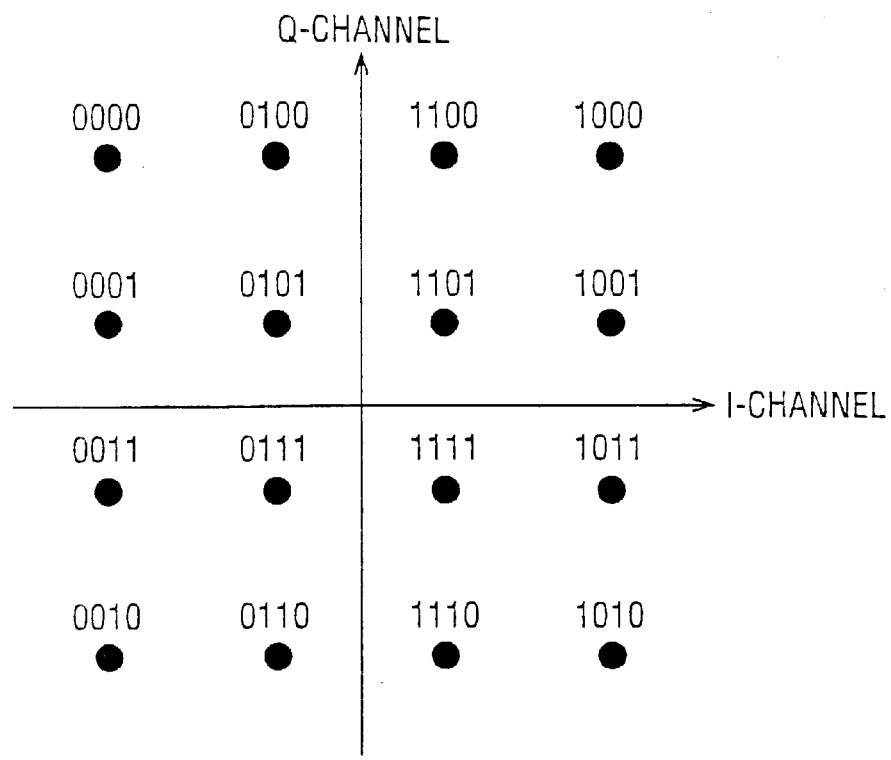
FIGS. 5 to 7 show different mappings.
Figure 6:
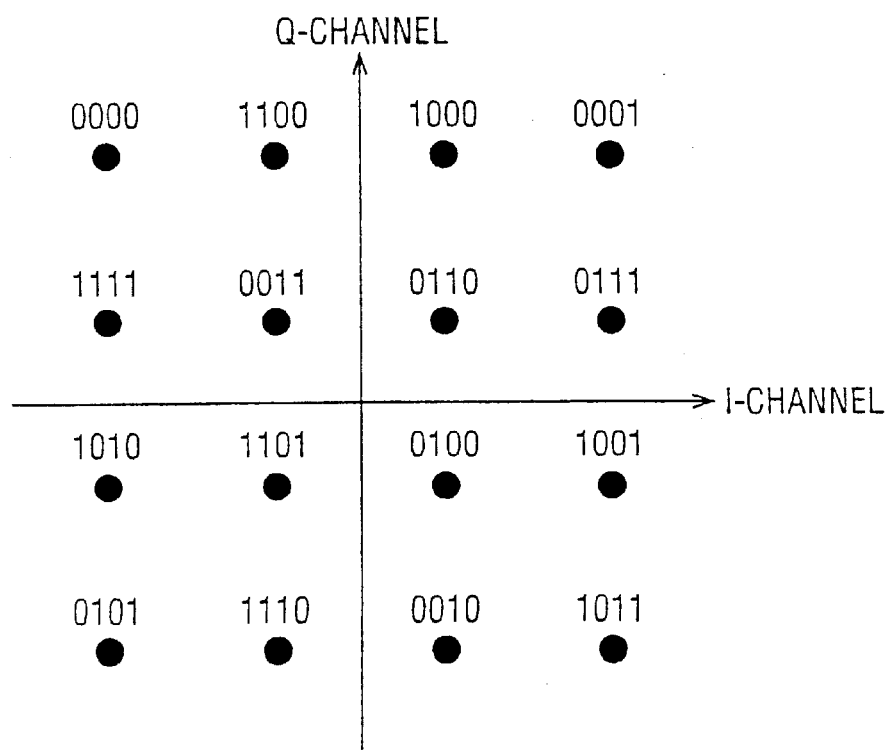
Figure 7:
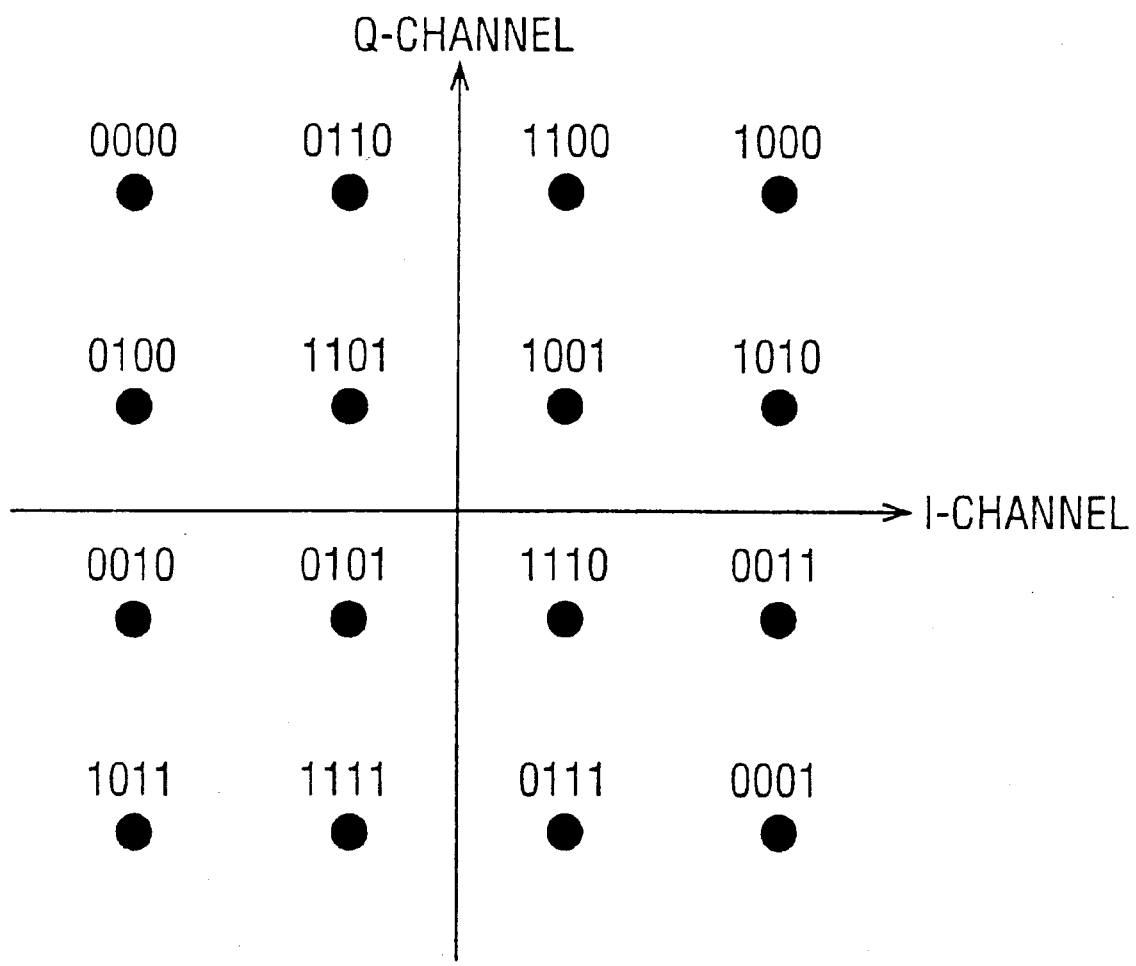

A plurality of mappings is generated and their mean unconditional bitwise mutual informations $I_o$ are calculated. Examples are shown in FIGS. 5 to 7. The mapping shown in FIG. 5 is a Gray mapping and has $I_o$=0.54 bit per complex dimension at $E_b/N_o$=3 dB code rate 1:2. FIG. 6 shows a mapping for 16QAM and has $I_o$=0.23 bit per complex dimension at $E_b/N_o$=3 dB. FIG. 7 is another mapping for 16QAM and has $I_o$32 0.36 bit per complex dimension at $E_b/N_o$=3 dB.

For a given combination of channel conditions and number of iterations, the channel conditions for which results have been obtained and which are nearest to the estimated conditions are used in combination with the number of iterations, to identify the best mapping. The mappings are stored in a mapping look up table with the respective $I_o$. Having found the required $I_o$ from the $I_o$ look-up table, the desired mapping is found by addressing the mapping look-up table by means of the required $I_o$. Alternatively, the mapping look-up table may also contain the combinations of channel conditions and number of iterations, for which it is the best mapping, that having been identified by $I_o$. The mapping look-up tables then addressed directly by the combination of the number of iterations and the channel condition nearest to those pertaining.

The choice of mapping can be made at the receiver and transmitted to the transmitter. Alternatively the number of iterations to be used and the estimated channel conditions can be transmitted to the transmitter where the choice is made and then transmitted to the receiver.

What is claimed is:

1. A digital transmission system, comprising:
   a coder for coding an input signal with an error checking or error correcting code, an interleaver for interleaving the bits of the coded signal,
   a mapper for mapping the interleaved coded signal into a multilevel signal, and a transmitter for sending the multilevel signal over a noisy channel in a transmission medium;
   a receiver for receiving the multilevel signal distorted by noise (noisy multilevel signal), a demapper having a first input for receiving the noisy multilevel signal and operative to provide a soft demapped signal at an output, a deinterleaver, for deinterleaving the demapped signal, a decoder to decode the deinterleaved demapped signal to provide a soft decoded signal, an interleaver to interleave the decoded signal, the demapper having a second input for receiving the interleaved decoded signal and being operative to recalculate the demapped signal iteratively using the noisy signal and the soft decoded signal,
   characterized by:
      a mapping store for storing a plurality of different mappings;
      means for deriving an indication of the channel conditions; and
      means for selecting the optimum mapping of the plurality dependent on the derived indication of channel conditions, the mapper and demapper being operatively responsive to the selected mapping.

2. A digital transmission system, as claimed in claim 1, wherein the indication of the channel conditions is the signal to noise ratio.

3. A digital transmission system, as claimed in claim 1, in which the soft output signals of the demapper and the decoder are likelihood ratios.

4. A digital transmission system, as claimed in claim 1, in which the soft output signals of the demapper and the decoder are log-likelihood ratios.

5. A digital transmission system, comprising:
   a coder for coding an input signal with an error checking or error correcting code, an interleaver for interleaving the bits of the coded signal,
   a mapper for mapping the interleaved coded signal into a multilevel signal, and a transmitter for sending the multilevel signal over a noisy channel in a transmission medium;
   a receiver for receiving the multilevel signal distorted by noise (noisy multilevel signal), a demapper having a first input for receiving the noisy multilevel signal and operative to provide a soft demapped signal at an output, a deinterleaver, for deinterleaving the demapped signal, a decoder to decode the deinterleaved demapped signal to provide a soft decoded signal, an interleaver to interleave the decoded signal, the demapper having a second input for receiving the interleaved decoded signal and being operative to recalculate the demapped signal iteratively using the noisy signal and the soft decoded signal,
   characterized by:
      a mapping store for storing a plurality of different mappings;
      means for determining the number of iterations to be carried out from a plurality of possible numbers of iteration; and
      means for selecting the optimum mapping of the plurality, dependent on the number of iterations as determined, the mapper and demapper being operatively responsive to the selected mapping.

6. A digital transmission system, as claimed in claim 5, in which the soft output signals of the demapper and the decoder are likelihood ratios.

7. A digital transmission system, as claimed in claim 5, in which the soft output signals of the demapper and the decoder are log-likelihood ratios.

8. A digital transmission system, comprising:
   a coder for coding an input signal with an error checking or error correcting code, an interleaver for interleaving the bits of the coded signal,
   a mapper for mapping the interleaved coded signal into a multilevel signal, and a transmitter for sending the multilevel signal over a noisy channel in a transmission medium;
   a receiver for receiving the multilevel signal distorted by noise (noisy multilevel signal), a demapper having a first input for receiving the noisy multilevel signal and operative to provide a soft demapped signal at an output, a deinterleaver, for deinterleaving the demapped signal, a decoder to decode the deinterleaved demapped signal to provide a soft decoded signal, an interleaver to interleave the decoded signal, the demapper having a second input for receiving the interleaved decoded signal and being operative to recalculate the demapped signal iteratively using the noisy signal and the soft decoded signal,
   characterized by:
      a mapping store, storing a plurality of different mappings;means for deriving an indication of the channel conditions;
      means for determining the number of iterations to be carried out from a plurality of possible numbers of iterations; and
      means for selecting the optimum mapping of the plurality dependent on the derived indication of channel conditions and on the number of iterations as determined, the mapper and demapper being operatively responsive to the selected mapping.

9. A digital transmission system, as claimed in claim 8, wherein the indication of the channel conditions is the signal to noise ratio.

10. A digital transmission system, as claimed in claim 8, in which the soft output signals of the demapper and the decoder are likelihood ratios.

11. A digital transmission system, as claimed in claim 8, in which the soft output signals of the demapper and the decoder are log-likelihood ratios.

12. A digital transmission system, as claimed in claim 8, wherein each mapping is stored with an indication of its mutual information, and including a mutual information store storing an approximation of the optimum mutual information with a plurality of respective combinations of channel conditions and number of iterations, the means for selecting a mapping being operative to identify an optimum mutual information from the number of iterations as determined and the nearest stored channel conditions to the derived indication, and to select the mapping from the plurality for which the stored mutual information is nearest to the identified optimum.

13. A method of transmitting a digital signal, comprising: coding an input signal with an error checking or error correcting code, interleaving the bits of the coded signal, mapping the interleaved coded signal into a multilevel signal, sending the multilevel signal over a noisy channel in a transmission medium;

receiving the multilevel signal distorted by noise (noisy multilevel signal), demapping the noisy multilevel signal to provide a soft demapped signal at an output, deinterleaving the demapped signal, decoding the deinterleaved demapped signal to provide a soft decoded signal, interleaving the decoded signal, recalculating the demapped signal iteratively using the noisy signal and the soft decoded signal, characterized by:

storing a plurality of different mappings;

deriving an indication of the channel conditions; and selecting the optimum mapping and of the plurality dependent on the derived indication of channel conditions, the mapping and demapping being operatively responsive to the selected mapping.

14. A method of transmitting a digital signal, as claimed in claim 13, wherein the indication of the channel conditions is the signal to noise ratio.

15. A method of transmitting a digital signal, as claimed in claim 13, in which the soft demapped and soft decoded signals are likelihood ratios.

16. A method of transmitting a digital signal, as claimed in claim 13, in which the soft demapped and soft decoded signals are log-likelihood ratios.

17. A method of transmitting a digital signal, comprising:

coding an input signal with an error checking or error correcting code, interleaving the bits of the coded signal, mapping the interleaved coded signal into a multilevel signal, sending the multilevel signal over a noisy channel in a transmission medium;

receiving the multilevel signal distorted by noise (noisy multilevel signal), demapping the noisy multilevel signal to provide a soft demapped signal at an output, deinterleaving the demapped signal, decoding the deinterleaved demapped signal to provide a soft decoded signal, interleaving the decoded signal, recalculating the demapped signal iteratively using the noisy signal and the soft decoded signal, characterized by:

storing a plurality of different mappings;

determining the number of iterations to be carried out from a plurality of possible numbers of iteration; and selecting the optimum mapping and of the plurality, dependent on the number of iterations as determined, the mapping and demapping being operatively responsive to the selected mapping.

18. A method of transmitting a digital signal, as claimed in claim 17, in which the soft demapped and soft decoded signals are likelihood ratios.

19. A method of transmitting a digital signal, as claimed in claim 17, in which the soft demapped and soft decoded signals are log-likelihood ratios.

20. A method of transmitting a digital signal, comprising:

coding an input signal with an error checking or error correcting code, interleaving the bits of the coded signal, mapping the interleaved coded signal into a multilevel signal, sending the multilevel signal over a noisy channel in a transmission medium;

receiving the multilevel signal distorted by noise (noisy multilevel signal), demapping the noisy multilevel signal and to provide a soft demapped signal at an output, deinterleaving the demapped signal, decoding the deinterleaved demapped signal to provide a soft decoded signal, interleaving the decoded signal, recalculating the demapped signal iteratively using the noisy signal and the soft decoded signal, characterized by:

storing a plurality of different mappings;

deriving an indication of the channel conditions; determining the number of iterations to be carried out from a plurality of possible numbers of iterations; and selecting the optimum mapping and of the plurality dependent on the derived indication of channel conditions and on the number of iterations as determined, the mapping and demapping being operatively responsive to the selected mapping.

21. A method of transmitting a digital signal, as claimed in claim 20, wherein the indication of the channel conditions is the signal to noise ratio.

22. A method of transmitting a digital signal, as claimed in claim 20, in which the soft demapped and soft decoded signals are likelihood ratios.

23. A method of transmitting a digital signal, as claimed in claim 20, in which the soft demapped and soft decoded signals are log-likelihood ratios.

24. A method of transmitting a digital signal, as claimed in claim 20, wherein each mapping is stored with an indication of its mutual information, and including storing an approximation of the optimum mutual information with a plurality of respective combinations of channel conditions and number of iterations, the step of selecting a mapping being operative to identify an optimum mutual information from the number of iterations as determined and the nearest stored channel conditions to the derived indication, and to select the mapping from the plurality for which the stored mutual information is nearest to the identified optimum.

\* \* \* \* \*